United States Patent [19]

Oshima

[11] 3,727,114

[45] Apr. 10, 1973

[54] AIR COOLED SEMICONDUCTOR STACK

[75] Inventor: Seiichi Oshima, Itami, Japan

[73] Assignee: Mitsubishi Denki Kabushiki Kaisha, Tokyo, Japan

[22] Filed: Aug. 3, 1971

[21] Appl. No.: 168,559

[52] U.S. Cl.........317/234 R, 317/234 A, 317/234 P, 317/234 W, 165/80

[51] Int. Cl...............................H01l 3/00, H01l 5/00

[58] Field of Search..........................317/234, 235, 1, 317/1.5, 6, 11; 165/80

[56] References Cited

UNITED STATES PATENTS

| | | | |
|---|---|---|---|
| 1,845,573 | 2/1932 | Ackerly | 317/234 |
| 2,486,768 | 11/1949 | Walker | 317/234 |
| 2,815,472 | 12/1957 | Jackson et al. | 317/234 |
| 3,280,389 | 10/1966 | Martin | 317/234 |
| 3,364,987 | 1/1968 | Bylund et al. | 317/234 |

FOREIGN PATENTS OR APPLICATIONS

| | | | |
|---|---|---|---|
| 905,361 | 9/1962 | Great Britain | 317/234 |
| 710,282 | 9/1941 | Germany | 317/234 |

*Primary Examiner*—John W. Huckert
*Assistant Examiner*—Andrew J. James
*Attorney*—E. F. Wenderoth et al.

[57] ABSTRACT

A pair of end plates having windows sandwiches an alternate assembly of semiconductor elements and finned cooling members and is fastened by stud bolts to form a semiconductor stack. The windows of the end plates serve to pass a flow of cooling air in the direction of the longitudinal axis of the stack. Cooling fins on the cooling members extend along and substantially radially with respect to the longitudinal axis of the semiconductor stack.

6 Claims, 5 Drawing Figures

PATENTED APR 10 1973

3,727,114

SHEET 1 OF 2

SEIICHI USHIMA,
*INVENTOR*

BY *Wenderoth, Lind & Ponack*

ATTORNEYS

SEIICHI ŌSHIMA,
*INVENTOR*

BY Wenderoth, Lind & Ponack
ATTORNEYS

AIR COOLED SEMICONDUCTOR STACK

BACKGROUND OF THE INVENTION

1. Field of the Invention

This invention relates to a pressure contact type semiconductor stack having an improved cooling structure.

2. Description of the Prior Art

The conventional pressure contact type semiconductor stack has comprised a plurality of pressure contact type flat package type semiconductor elements and a plurality of cooling members having circumferencially extending cooling fins, the semiconductor elements and the cooling members being brought in a pressure contact relationship by means of a pair of end plates and stud bolts. To cool such a conventional semiconductor stack by air, the stack has been so positioned in a wind tunnel that its longitudinal axis intersects at substantially right angles with a flow direction of cooling air produced by a powerful pressure blower.

With the conventional system for cooling the semiconductor stack, however, because the semiconductor stack has had to be transversely placed in a wind tunnel, the diameter of the wind tunnel used has inevitably been changed in accordance with the overall length of the stack. Also, since the smallest blower easily available in the market is of about 300 $\phi$ mm in diameter, the overall dimensions of the system including a wind tunnel cannot be reduced to reasonable values even when the semiconductor stack itself is small in dimensions.

SUMMARY OF THE INVENTION

Accordingly, an object of the invention is to provide a pressure contact type semiconductor stack having an improved cooling structure suitable for use in such a stack.

Another object of the invention is to provide a pressure contact type semiconductor stack having a compact and economical cooling structure.

Still another object of the invention is to provide a pressure contact type semiconductor stack having improved end plates and improved cooling members especially suitable for use in cooling the semiconductor stack.

Further object of the invention is to provide a pressure contact type semiconductor stack with a blower directly mounted to the stack.

Still further object of the invention is to provide a pressure contact type semiconductor stack capable of being effectively cooled without employing a wind tunnel.

In view of the above objects, the pressure contact type semiconductor stack of the present invention is arranged to be cooled by a flow of cooling air flowing along the longitudinal axis of the stack. For this purpose, the semiconductor stack comprises a plurality of semiconductor elements, a plurality of cooling members disposed alternately with the semiconductor elements, and a pair of end plates and stud bolts for assembling the semiconductor stack. The cooling fins on the cooling members extend along and substantially radially with respect to the longitudinal axis of the semiconductor stack, and the end plates disposed on both ends of the stack have some windows for permitting a flow of cooling air to pass therethrough in the direction of the longitudinal axis of the stack. One of the end plates may be so arranged that a blower is directly mounted thereon.

BRIEF DESCRIPTION OF THE DRAWING

The invention will become more readily apparent from the following detailed description taken in conjunction with the accompanying drawings in which.

Throughout several Figures the same reference characters designate identical or corresponding components.

DESCRIPTION OF THE PREFERRED EMBODIMENTS

Figure 1A:
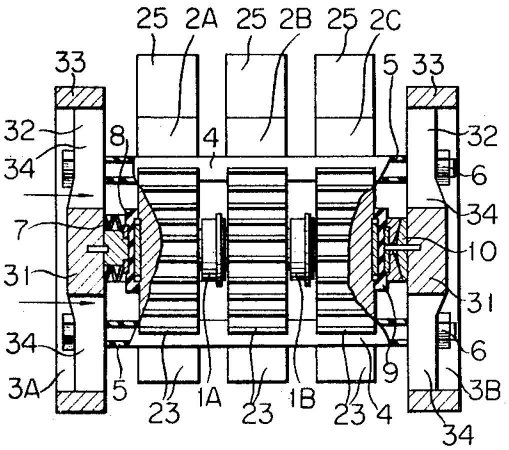
FIG. 1*a* is an explanatory plan view for showing, partly in section, the pressure contact type semiconductor stack constructed in accordance with the present invention.
Figure 1B:
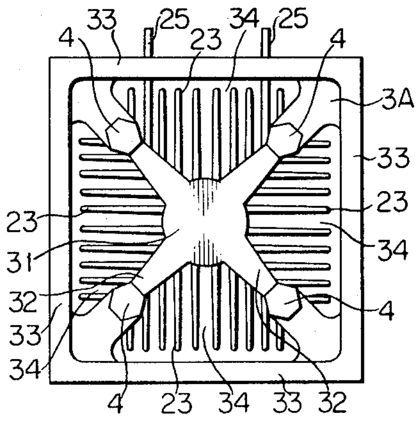
FIG. 1*b* is a side view of the stack shown in FIG. 1*a;*

Referring now to the drawings and in particular to FIGS. 1*a* and 1*b*, a pressure contact type semiconductor stack constructed in accordance with the present invention comprises two pressure contact type semiconductor elements 1A and 1B of a known type such as flat package type thyristors or flat package type diodes, which, if desired, may increase or decrease in number. It is to be noted that although the illustrated semiconductor stack has semiconductor elements arranged in an electrically series relationship, the arrangement can be modified by inserting any suitable insulating material into the proper position between the semiconductor elements.

The semiconductor elements 1A and 1B are directly sandwiched between the cooling members 2A and 2B and between the cooling members 2B and 2C respectively. In other words, two semiconductor elements 1A and 1B and three cooling members 2A, 2B and 2C constitute an alternating assembly. The assembly thus arranged is sandwiched by a pair of end plates 3A and 3B and fastened by four stud bolts 4 extending between the pair of end plates 3A and 3B. Each of the stud bolts 4 extends through guide bores formed on the end plates 3A and 3B and guide bores formed on the cooling members 2A, 2B and 2C which will be described later in detail in conjunction with FIGS. 2 and 3.

In order to electrically insulate the semiconductor elements 1A and 1B and the cooling members 2A, 2B and 2C from any other components such as the end plates 3A and 3B and the stud bolts 4, an insulating tube 5 of any suitable insulating material is applied to the stud bolts 4 between both the end plates 3A and 3B to cover the peripheral surface thereof. Each of the stud bolts 4 has a screw threaded portion on its one end for engagement of a nut 6. Thus the stud bolts 4 produce a compression force which establishes a pressure contact relationship on the respective contact faces between the semiconductor elements 1A and 1B and the cooling members 2A, 2B and 2C.

The compression force produced by the stud bolts 4 and the nuts 6 should be modulated into a predetermined value profitable for the semiconductor elements 1A and 1B. For this purpose, disc springs 7 and an electrically insulating washer 8 are disposed between the end plate 3A and the cooling member 2A. In order to ensure that the compression force is uniformly distributed to provide a uniform pressure contact relationship to the contact faces between the semiconductor elements and the cooling members, an insulating washer 9 and a self-aligning seat 10 are disposed between the end plate 3B and the cooling member 2C.

Figure 2:
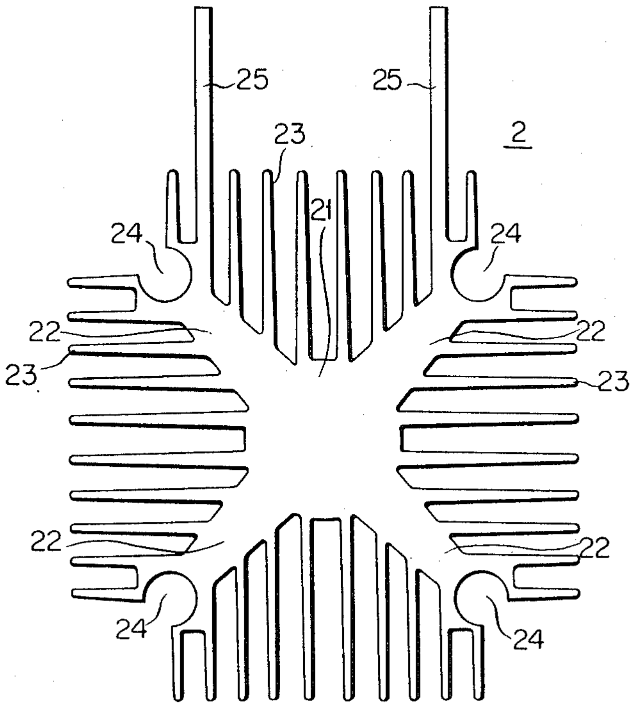
FIG. 2 is a view showing the cooling member for use in the semiconductor stack shown in FIGS. 1*a* and 1*b;*

FIG. 2 shows one of the cooling members for use in the semiconductor stack shown in FIGS. 1*a* and 1*b*. The cooling member 2 made of any suitable electrically conductive and heat conductive material comprises a substantially circular support portion 21 for supporting the semiconductor elements in pressure contact relationship, four leg portions 22 extending from the support portion 21 at equal angular intervals, a plurality of cooling fins 23 symmetrically extending from both sides of each of the legs 22 in such a relationship that they are in parallel with the longitudinal axis of the semiconductor stack, i.e., the axis along which the semiconductor elements are stacked, and that they intersect at angles of 45° with the axes of the legs 22. The cooling member further comprises a guide bore 24 for guiding the stud bolts 4 formed on the extremity of each of the legs 22, and two parallel terminal portions 25 extending in the same direction from two selected end portions of the legs 22. The terminals 25, which are considered to be elongated cooling fins 23, are connected to an external circuit (not shown).

Figure 3:
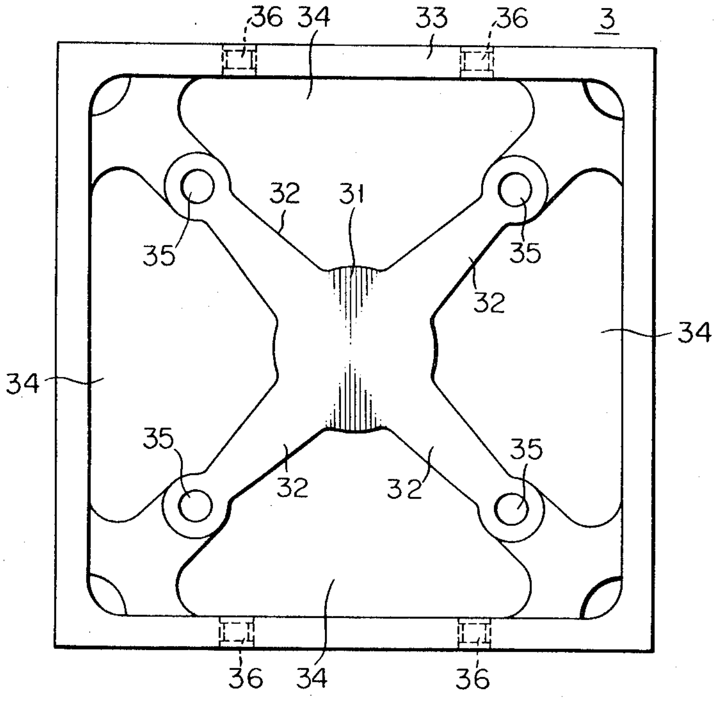
FIG. 3 is a view showing the end plate for use in the semiconductor stack shown in FIGS. 1*a* and 1*b.

FIG. 3 shows one of the end plates 3 for use in the semiconductor stack shown in FIGS. 1*a* and 1*b*. The end plate 3 comprises a support portion 31 similar to the support portion 21 of the cooling member 2. The support portion 31 has four leg portions 32 radially extending therefrom at equal angular intervals. The end plate 3 further comprises a rectangular frame portion 33 connected at its corners to the respective extremities of the legs 32. Thus the end plate 3 has four substantially triangular windows 34, which are defined by the legs 32 and the frame 33, for permitting the flow of cooling air to pass therethrough. On each of the legs 32, there is provided a bore 35 for guiding the stud bolt 4 previously described in conjunction with FIGS. 1*a* and 1*b* at that position corresponding to the guide bore 24 of the cooling member 2.

In order to combine the semiconductor stack with another similar semiconductor stack, the end plate 3 may have bores 36 on the frame 33 through which the stacks to be combined can be put together by means of bolts and nuts for example.

To cool the semiconductor stack thus constructed, a flow of cooling air produced by any type of blower is supplied in the direction of the longitudinal axis of the stack as shown by the arrows of FIG. 1*a*. Then the flow of cooling air passes through the windows 34 of the end plate 3A to flow between the cooling fins 23 formed around the cooling members 2A, 2B and 2C, thereby to cool the semiconductor elements which are brought in the pressure contact relationships with the cooling members 2.

It is known that, when a flow of air of a speed of from 1 to 2 m/sec is applied to the semiconductor stack thus constructed, the thermal resistance of the cooling member is reduced to from three-fourth to one-half of that under the natural cooling condition, and that such a flow speed is sufficiently high for effectively cooling the semiconductor stack. For applying a flow of air of such a relatively low speed, it is not required to install a wind tunnel around the semiconductor stack. Therefore, the semiconductor stack of the present invention eliminates the necessity of employing a wind tunnel.

Although the flow of cooling air may be produced by any type of conventional system, it is of great convenience in practical use to directly mount a blower to the semiconductor stack.

Figure 4:
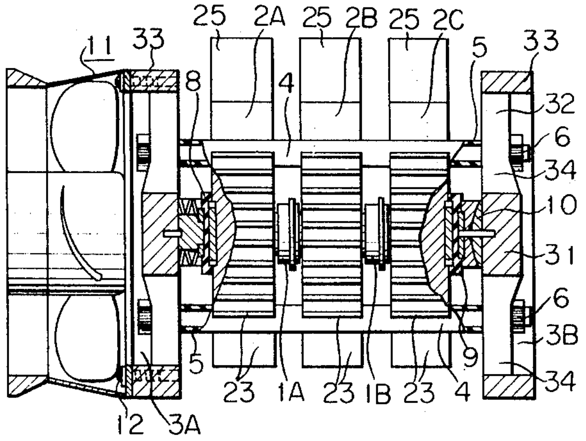
* and FIG. 4 is a plan view similar to FIG. 1*a* but showing the semiconductor stack with a blower.

FIG. 4 illustrates the pressure contact type semiconductor stack with a cooling fan or a blower 11 directly attached to one of the end plates 3A. The blower 11 which may be of any conventional type is mounted to the frame 33 of the end plate 3A by means of screws 12 and the screw threaded bores formed on each corners of the frame portion 33. When the blower 11 is energized by an electrical source (not illustrated), a flow of air designated by the arrows is produced and it passes through the windows 34 of the end plate 3A to flow between the cooling fins 23 formed on the cooling members 2A, 2B and 2C, thereby to cool the semiconductor elements 1A and 1B. Thereafter, the air flow leaves the semiconductor stack through the windows 34 of the end plate 3B.

Although the semiconductor stack illustrated in FIG. 4 has only one blower on its one of the end plates 3A, if the overall length of the stack becomes long and effective cooling of the cooling member remote from the blower cannot be expected, an additional blower similar to that illustrated may be mounted on the other end plate 3B. For this purpose, the end plate 3B may also have screw threaded bores similar to those of the end plate 3A on its corners.

With the arrangement of the semiconductor stack as has heretofore been described, the stack can be effectively cooled by a relatively small and less powerful blower without employing a wind tunnel. Therefore the whole system of the semiconductor stack including a blower can be made compact and simple in construction. Also, since the semiconductor stack is arranged to be cooled by an air flow flowing along its longitudinal axis, even when the number of the semiconductor elements used increases, it is only the overall length of the stack that increases, and the diameter of the blower is not required to be increased. This provides an increase in exchangeability of the components, leading to an economical arrangement.

Furthermore, the semiconductor stack does not produce noise as with the conventional cooling system employing a wind tunnel. In addition, mounting and dismounting of the blower 11 can be easily performed.

What I claim is:

1. A pressure contact type semiconductor stack comprising a plurality of semiconductor elements, a plurality of cooling members each having a plurality of cooling fins and disposed in alternately stacked relationship with said semiconductor elements, said cooling fins being formed in parallel with and substantially radially with respect to the axis along which the semiconductor elements and the cooling members are stacked, a pair of end plates sandwiching said semiconductor elements and said cooling members therebetween in the direction in which the semiconductor elements and the cooling members are stacked, and holding means for holding said semiconductor elements and said cooling members between said pair of end plates to establish pressure contact relationship therebetween, each of said end plates having windows for a flow of cooling air, thereby to cool the semiconductor stack by a flow of cooling air flowing in the direction of the axis along which the semiconductor elements and the cooling members are stacked.

2. A pressure contact type semiconductor stack as claimed in claim 1, wherein each of said end plates comprises support means for supporting said semiconductor elements and said cooling members, plurality of leg portions radially extending from said support means, and a frame portion connecting extremities of said leg portions, thereby to form said windows for the flow of cooling air.

3. A pressure contact type semiconductor stack as claimed in claim 2, wherein each of said leg portions has a guide bore for guiding said holding means, which are stud bolts.

4. A pressure contact type semiconductor stack as claimed in claim 1, wherein each of said cooling members comprises support means for supporting said semiconductor elements, a plurality of leg portions radially extending from said support means, and a plurality of said cooling fins extending from said leg portions in parallel with and substantially radially with respect to said axis along which the semiconductor elements and the cooling members are stacked.

5. A pressure contact type semiconductor stack as claimed in claim 4, wherein each of said leg portions of the cooling members has a guide bore for guiding said holding means, which are stud bolts.

6. A pressure contact type semiconductor stack as claimed in claim 1, wherein at least one of said end plates has a blower directly mounted thereon, thereby to produce a flow of cooling air flowing in the direction of the axis along which the semiconductor elements and the cooling members are stacked.

* * * * *